United States Patent
Park et al.

(10) Patent No.: US 9,899,569 B2
(45) Date of Patent: Feb. 20, 2018

(54) PATTERNED SUBSTRATE FOR GALLIUM NITRIDE-BASED LIGHT EMITTING DIODE AND THE LIGHT EMITTING DIODE USING THE SAME

(71) Applicant: Research Cooperation Foundation of Yeungnam University, Gyeongsangbuk-do (KR)

(72) Inventors: Si Hyun Park, Daegu (KR); Hao Cui, Gyeongsangbuk-do (KR)

(73) Assignee: Research Cooperation Foundation of Yeungnam University, Gyeongsangbuk-do (KR)

( * ) Notice: Subject to any disclaimer, the term of this patent is extended or adjusted under 35 U.S.C. 154(b) by 0 days.

(21) Appl. No.: 14/923,935

(22) Filed: Oct. 27, 2015

(65) Prior Publication Data
US 2016/0315222 A1    Oct. 27, 2016

(30) Foreign Application Priority Data

Apr. 23, 2015  (KR) .................. 10-2015-0057510
May 19, 2015  (KR) .................. 10-2015-0069943

(51) Int. Cl.
*H01L 29/15* (2006.01)
*H01L 33/32* (2010.01)
*H01L 33/20* (2010.01)

(52) U.S. Cl.
CPC .............. *H01L 33/32* (2013.01); *H01L 33/20* (2013.01)

(58) Field of Classification Search
CPC ......... H01L 33/06; H01L 33/20; H01L 33/22; H01L 33/32

USPC .......................................... 257/76, 81, 95, 99
See application file for complete search history.

(56) References Cited

U.S. PATENT DOCUMENTS

| | | | |
|---|---|---|---|
| 2010/0025684 A1 | 2/2010 | Shinohara et al. | |
| 2011/0198560 A1* | 8/2011 | Okagawa | C23C 16/0236 257/13 |
| 2012/0305965 A1* | 12/2012 | Tseng | H01L 33/32 257/98 |
| 2014/0138613 A1* | 5/2014 | Kim | H01L 33/22 257/13 |

FOREIGN PATENT DOCUMENTS

| CN | 103762287 A | 4/2014 |
|---|---|---|
| JP | 2005047718 A | 2/2005 |
| JP | 2010103578 A | 5/2010 |
| KR | 20060120947 A | 11/2006 |
| KR | 20120084839 A | 7/2012 |
| KR | 20120008577 U | 12/2012 |

OTHER PUBLICATIONS

Office Action issued in corresponding CN Application No. 201510736920.4 with partial English translation dated Nov. 30, 2017 (8 pages).

* cited by examiner

*Primary Examiner* — Hung Vu
(74) *Attorney, Agent, or Firm* — Osha Liang LLP

(57) ABSTRACT

The present invention provides a patterned substrate for gallium nitride-based light emitting diode, comprising: a patterned substrate having patterns, wherein the plurality of patterns are circle type having diameters (d) and the distances between the centers of the patterns are pitches (p), and the cross sections of the patterns are extruded shapes and have heights (h), and wherein the value of [diameter (d)/ pitch (p)] is larger than (2.6)/3, and equal or smaller than 3/3.

6 Claims, 7 Drawing Sheets

FIG. 9

| patterned sapphire substrat(PSS) type | patterned sapphire substrate | flip-chip type LED with PSS |
|---|---|---|
| ① extruded pattern. smooth back surface | 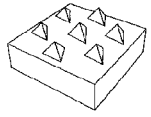 | 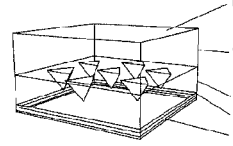 Fresnel loss surface (smooth surface); extruded patterned sapphire substrate; n-GaN; MQWs; p-GaN |
| ② subtracted pattern. smooth back surface | 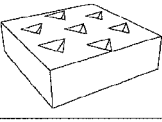 | 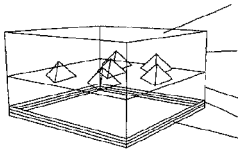 Fresnel loss surface (smooth surface); subtracted patterned sapphire substrate; n-GaN; MQWs; p-GaN |
| ③ extruded pattern. randomly-roughened back surface | 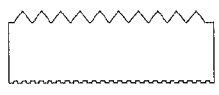 | 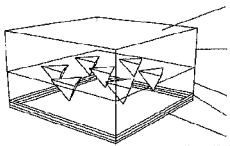 Lambertian surface (randomly-roughened surface); extruded patterned sapphire substrate; n-GaN; MQWs; p-GaN |
| ④ subtracted pattern. randomly-roughened back surface | 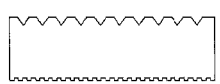 | 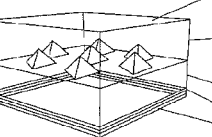 Lambertian surface (randomly-roughened surface); subtracted patterned sapphire substrate; n-GaN; MQWs; p-GaN |

PATTERNED SUBSTRATE FOR GALLIUM NITRIDE-BASED LIGHT EMITTING DIODE AND THE LIGHT EMITTING DIODE USING THE SAME

CROSS-REFERENCE TO RELATED APPLICATION

This application claims priority to and the benefit of Korean Patent Application No. 2015-0069943, filed on May 19, 2015 and Korean Patent Application No. 2015-0057510, filed on Apr. 23, 2015, the disclosure of which is incorporated herein by reference in its entirety.

BACKGROUND

1. Field of the Invention

The present invention relates to a patterned substrate for gallium nitride-based light emitting diode and the light emitting diode using the same. The present invention can provide the optimization of the patterns in the patterned substrate.

2. Discussion of Related Art

Light-emitting diodes (LEDs) have attracted much attention as light sources for applications such as indicator lights on devices, traffic lights, automobile lighting, and indoor and outdoor lighting, including street lighting. This is due to their low energy consumption, long lifetime, robustness, absence of a warm-up period, favorable controllability, and good color rendering. To include a wider range of applications, improvements in the efficiencies of LEDs are required.

The light-extraction efficiency (LEE) of LEDs is an important parameter. The LEE of an LED is defined as the ratio of the number of photons emitted into free space from an LED chip to the number of photons emitted from the active region inside the LED chip. It is limited by total internal reflection inside the LED semiconductor chip, which typically has a larger refractive index than the surrounding material.

When the light generated from the active region inside the semiconductor is incident upon the interface between the semiconductor and the surrounding space, if the angle of the emitted light exceeds the critical angle, TIR occurs and light is trapped inside the semiconductor, eventually being dissipated as heat. The LEE of an LED is typically small, because there is a large difference in refractive index between the semiconductor and the surrounding space. For example, the refractive index of gallium nitride (GaN) is 2.5, and the LEE of a GaN-based LED chip with a simple rectangular shape into free space is only 4%.

Numerous approaches have been used to improve the LEE, including the patterned sapphire substrates (PSSs). For example, Korean published patent application No. 2012-84839 is reported. PSSs employ arrayed patterns on the entire top surface of the sapphire that forms the LED substrate. Scattering and multiple reflection of the light inside the LED chip can be enhanced with these structures, breaking the TIR condition and therefore improving the LEE. The PSS can also serve to reduce the threading-dislocation density during the growth of LED epitaxial layers.

However, there are still a lot of requirement for improving the quality of patterned substrate.

SUMMARY OF THE INVENTION

One aspect of the present invention provides a patterned substrate for gallium nitride-based light emitting diode, comprising: a patterned substrate having patterns, wherein the plurality of patterns are circle type having diameters (d) and the distances between the centers of the patterns are pitches (p), and the cross sections of the patterns are extruded shapes and have heights (h), and wherein the value of [diameter (d)/pitch (p)] is larger than 2.6/3, and equal or smaller than 3/3.

Preferably, the heights (h) are larger than $(d/2)-0.10$ μm and the smaller than $(d/2)+0.10$ μm and the heights (h) are $(d/2)$s.

Preferably, the gallium nitride-based light emitting diode is horizontal type.

According to another aspect of the present invention, there is provided a gallium nitride-based light emitting diode having a patterned substrate, comprising: a patterned substrate having patterns, wherein the plurality of patterns are circle type having diameters (d) and the distances between the centers of the patterns are pitches (p), and the cross sections of the patterns are extruded shapes and have heights (h), and wherein the value of [diameter (d)/pitch (p)] is larger than 2.6/3, and equal or smaller than 3/3.

Other aspect of the present invention provides a patterned substrate for flip chip gallium nitride-based light emitting diode, comprising: a patterned substrate having patterns on one side of the substrate, wherein the plurality of patterns are circle type having diameters (d) and the distances between the centers of the patterns are pitches (p), and the cross sections of the patterns are subtracted shapes and have heights.

Preferably, the patterns are triangle pyramid. Preferably, on the other side of the substrate, the random patterns are provided, the random patterns being equal or smaller than the peak wavelength of LED.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 9 shows graphs showing simulation results according to the embodiment of the present invention.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

(Planar Type LED)

Figure 1:
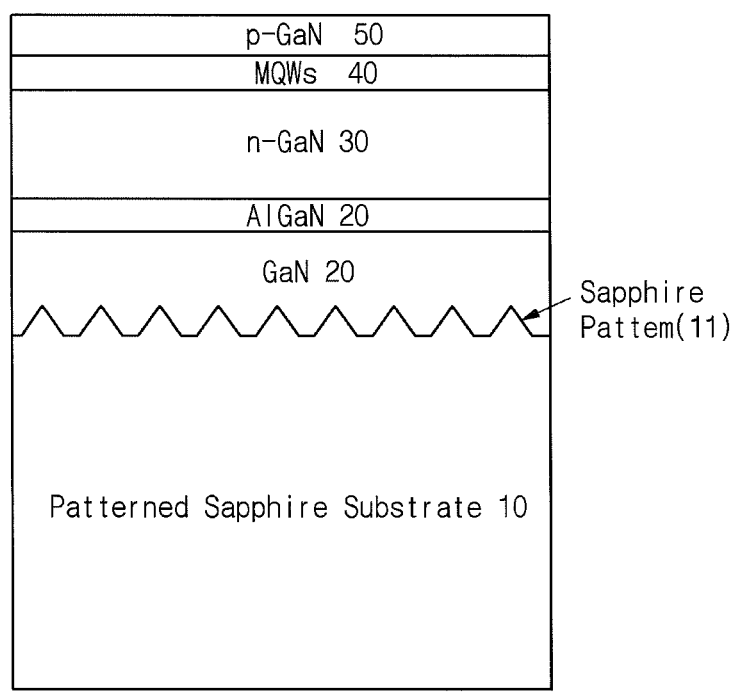
FIG. 1 is a cross section view of a planar LED including a patterned substrate according to an embodiment of the present invention.

FIG. 1 is a cross section view of a planar type light emitting diode including a patterned substrate according to an embodiment of the present invention.

Referring to FIG. 1, the planar type light emitting diode according to the embodiment of the present invention includes a sapphire substrate 10, buffer layer 20, a first doping type layer 30, an active layer 40, and, a second doping type layer 50.

The plurality of patterns 11 are provided on the one surface of the sapphire substrate 10. Each of the plurality of patterns has convex shape with half circle cross section. The plurality of patterns 11 can have a polygon type such as triangle, square, hexagonal are circle.

In the photonic device according to the embodiment of the present invention, the first doping type layer 30 and the second doping type layer 50 can be connected to out terminal through electrodes (not shown), respectively. For example, some parts of the active layer 40 and the second doping type layer 50 are removed horizontally with mesa shape. In this case, one electrode pad (not shown) is established on the second doping type layer 50 or a transparent electrode layer on the second doping type layer 50. The other electrode pad is provided on the first doping type layer 30.

However, the invention is not limited to this mesa type LED. Other type LEDs are also included in the present invention. For example, the electrode pads are provided on each surface side of the vertical or horizontal type planar type.

Figure 2:
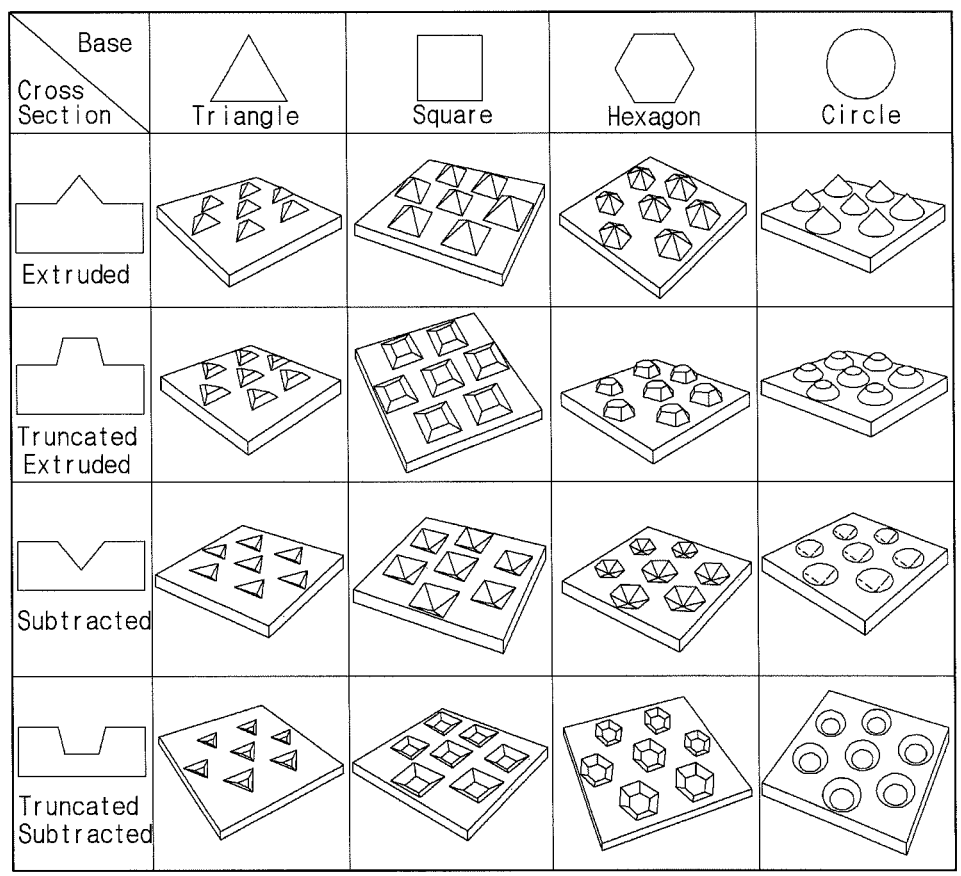
FIG. 2 shows a various kinds of patterned shapes in the patterned substrate according to an embodiment of the present invention.

FIG. 2 shows a various kinds of patterned shapes in the patterned substrate according to an embodiment of the present invention.

Referring to FIG. 2, the pyramid pattern with a circular base is also known as a cone. Four different cross sections of the pyramids were considered: extruded, subtracted, truncated-extruded, and truncated-subtracted. The global arrangement of the patterns on the sapphire substrate was a regular hexagonal array (or honeycomb), which is widely used due to its high degree of integration.

Figure 3:
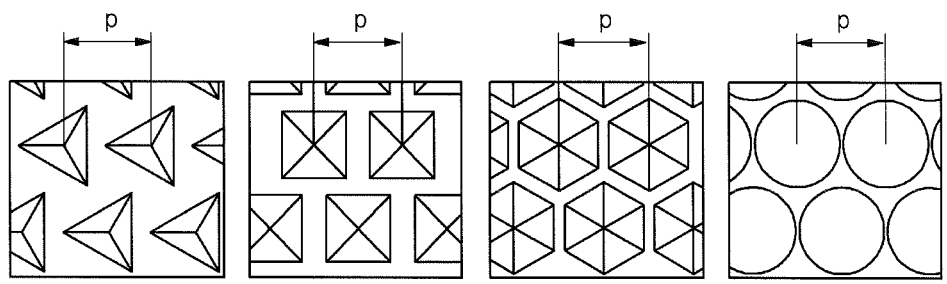
FIG. 3 shows the periodic patterns of FIG. 2

FIG. 3 shows a plan-view of the array patterns of the four different bases. In the examples shown in the figure, the diameter of the circumcircle is the same as the pitch (p), i.e. the pattern is a close-packed array of the circumcircle. We independently varied the circumcircle diameter and the pitch in addition to the vertical height of the patterns, and then carried out simulations for each pattern.

Figure 4:
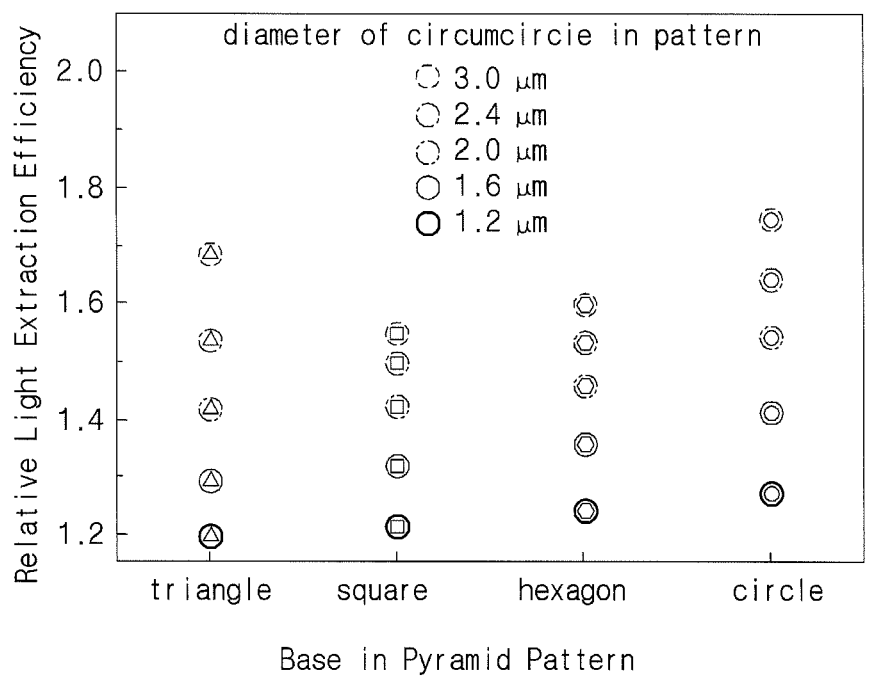
FIG. 4 through 6 are graphs showing simulation results according to the embodiment of the present invention.

FIG. 4 shows simulated relative LEEs (Light Extraction Efficiency) of the photonic devices with various polygonal pyramid patterns. The simulation was started with a pitch of p=3.0 μm, which is typical. We then varied the diameter of the circumcircle in each pattern in the range 1.2≤d≤3.0 m, i.e. with d in the range 0.4≤d/p≤1. The height of the pattern was h=d/2, so that the angle between slant edge and base was 45°.

The four regular pyramid bases (i.e., n=3, 4, 6, and c) were independently considered, and the extruded type was considered for the cross section of the pyramid. For each base shape, with a fixed pattern pitch, the LEE increased with the circumcircle diameter. In other words, the LEE increased as the fraction of the patterned surface area increased, and reached a maximum when the circumcircle diameter was at its maximum, i.e. d=p, a close-packed array.

This result is to be expected, as one may anticipate that the scattering of the trapped light inside the structure will increase as a function of the fraction of the surface that is covered by the patterns. With a fixed circumcircle diameter, the circular-base pyramid exhibited a larger LEE than those with n=3, 4, or 6. This is consistent with the above result, as the circular base has the largest proportion of patterned surface area. The hexagonal-base pyramid exhibited a larger LEE than the square-base pyramids; however, the triangular-base structures exhibited a larger LEE than the square- or hexagonalbase pyramids, despite the fact that the triangular structures had the largest proportion of unpatterned planar surface area.

The n=3 and n=∞ pyramids are therefore preferred. When the ratio with the circumcircle diameter remained fixed, so that we had a close-packed array of circumcircles (and the angle between the slant edge and the base was 45°, and the proportion of unpatterned planar surface was also unchanged) the LEE did not change as a function of pattern pitch. It follows that we may have freedom of choice over the pattern height, so that we have flexibility in terms of the conditions for sapphire etching and epitaxy for the growth of the LED structure.

Four cross-sectional shapes were considered: extruded, subtracted, truncated-xtruded, and truncated-subtracted. We fixed the pattern pitch at p=3.0 μm, and the diameter of the circumcircle at d=p. The vertical height of the pattern was also fixed, at h=d/2 for the non-truncated types and h=d/4 for the truncated shapes, so that the slant angles were fixed at 45° in all cases. The LEE was calculated for the four regular, convex pyramid bases, as shown in FIG. 5.

Figure 5:
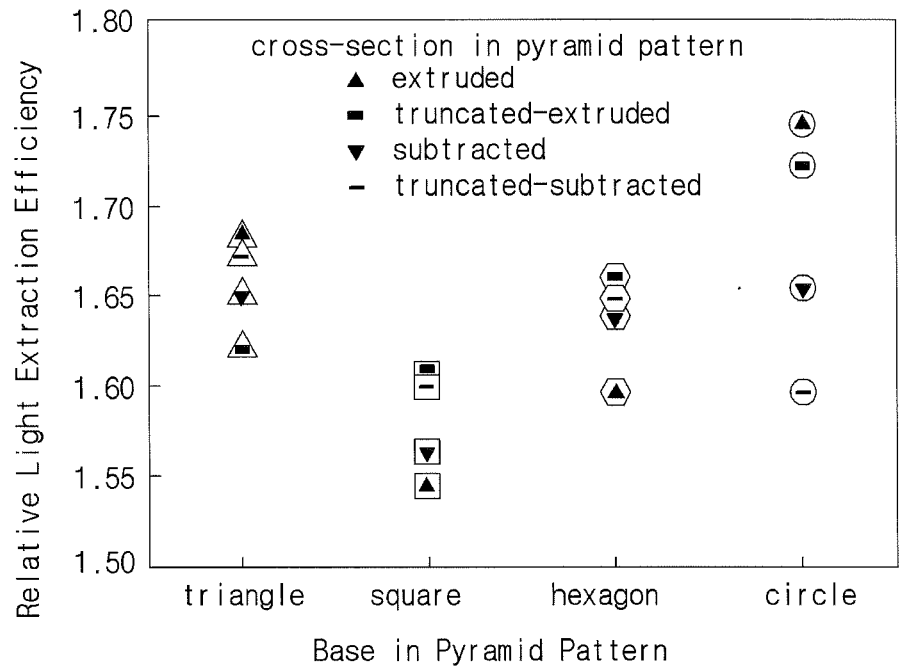

Referring to FIG. 5, the effect of the cross-sectional shape on LEE differed with base shape. The circular and triangular bases exhibited the largest LEE with the extruded cross section, followed by the truncated-extruded, the subtracted, and then the truncated-subtracted cross sections. For the square and hexagonal bases, the truncated-extruded cross section had the largest LEE, followed by the truncated-subtracted, the subtracted and then the extruded cross section. The LEE was largest with the circular base and the extruded cross section.

Figure 6:
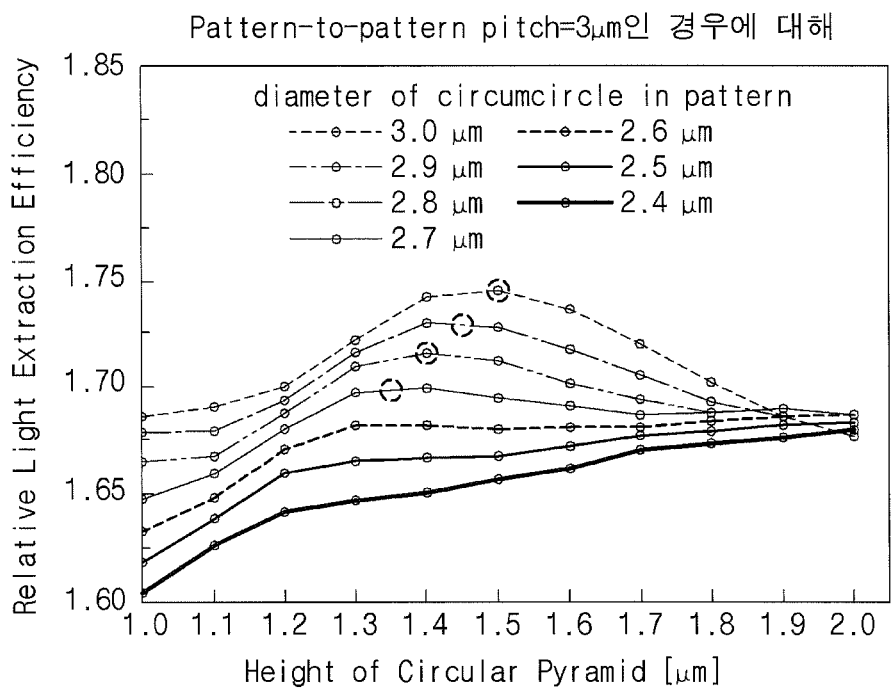

After determining the optimal geometry of the base and the cross section of the pyramid, we varied the vertical height, thereby varying the slant angle. FIG. 6 shows the LEE with the extruded circular-base pyramid patterns as a function of pattern height, for various diameters of circumcircles with a pitch of 3.0 μm.

For a given height of the pattern, the LEE increased with the diameter of the circumcircle. For a given circumcircle diameter, when d≤2.5 μm, the LEE increased with the height of the pattern.

In practical epitaxial growth, however, the height of the pattern should be limited to less than the thickness of the n-type GaN layer. For d greater than about 2.5 μm, the pattern has the optimum height for a maximum LEE under the given circumcircle's diameter. For example, with d=3.0 μm (a close-packed array of circumcircles), the LEE initially increased with increasing h, reached a maximum at h=1.5 μm, and then decreased with further increase in h.

The above simulation was performed with d=3.0 μm. But, the same results were found with different pitches. In the case the diameter d of circumcircle is 2.7 μm or 2.8 μm, the result were same with the case which d is changed to (d*2.7)/3 or (d*2.8)/3. Therefore, the ratio of diameter of circumcircle and pattern pitch is important, not the diameter of circumcircle itself nor the patent pitch itself. If we suppose that the pitch is 4.0 µm, as the diameter increases in same ratio, all results are same as that of p=3.0 µm.

Based on these results, the preferred patterned substrate for gallium nitride-based light emitting diode will be described.

As described, the circular and extruded shape pattern has excellent characteristics. Additionally, as the ratio of (diameter/pitch) gets closer to 1, LEE gets better. But, as the ratio of (diameter/pitch) gets closer to 1, planar area ratio (the area of no patterns to total area) is decreased. Due to this point, it is very difficult to make the epitaxy layer grow well. Therefore, in order to make the epitaxy layer grow well, it is effective that the planar area ratio needs to be fixed to a certain level of lower than 1.

If the planar area ratio needs to be fixed to a certain level of lower than 1, the height (h) can be used to maximize the LEE.

When the value of [diameter (d)/pitch (p)] is larger than 2.6/3, as height (h) increases, the LEE gets better. But, height (h) increases to larger that a certain point, epitaxy layer needs to be larger than the value of the height (h) to have reliable characteristics.

In the value of [diameter (d)/pitch (p)] is larger than 2.6/3, and equal or smaller than 3/3, when the heights (h) are (d/2), the LEE has its peak.

FIG. 6 shows the range of the peak. Referring to FIG. 6, when the value of [diameter (d)/pitch (p)] is 2.7/3, the LEE is excellent in the range of h of 1.2 µm to 1.5 µm. When the value of [diameter (d)/pitch (p)] is 2.8/3, the LEE is excellent in the range of h of 1.2 µm to 1.6 µm. When the value of [diameter (d)/pitch (p)] is 2.9/3, the LEE is excellent in the range of h of 1.2 µm to 1.7 µm. When the value of [diameter (d)/pitch (p)] is 3.0/3, the LEE is excellent in the range of h of 1.2 µm to 1.8 µm.

When the value of [diameter (d)/pitch (p)] gets closer to 3/3, the LEE gets the broader peak range according to the range of h. When the value of [diameter (d)/pitch (p)] gets closer to 2.6/3, the LEE gets the narrower peak range according to the range of h.

The preferred diameter, pitch, and height are follows.

In the value of [diameter (d)/pitch (p)] is larger than 2.6/3, and equal or smaller than 3/3, when the heights (h) are (d/2). To provide the margin of the design rule, it is preferable that the height (h) can have the range of 0.15 µm to 0.30 µm. More preferably, the heights (h) are larger than (d/2)−0.10 µm and the smaller than (d/2)+0.10 µm. In this case, the margin of 0.10 µm can be applied in manufacturing the reliable device in order to reduce the effect of the tolerance caused by etching. More preferably, the height (h) is (d/2).

(Flip Chip Type LED)

The patterned substrate for the flip-chip type LED has not studied much yet. In some parts, it has been considered that the patterned substrate for the flip-chip type LED be similar to that of horizontal or vertical type LED. Therefore, there are still a lot of requirement for improving the quality of patterned substrate for the flip-chip type LED.

Figure 7:
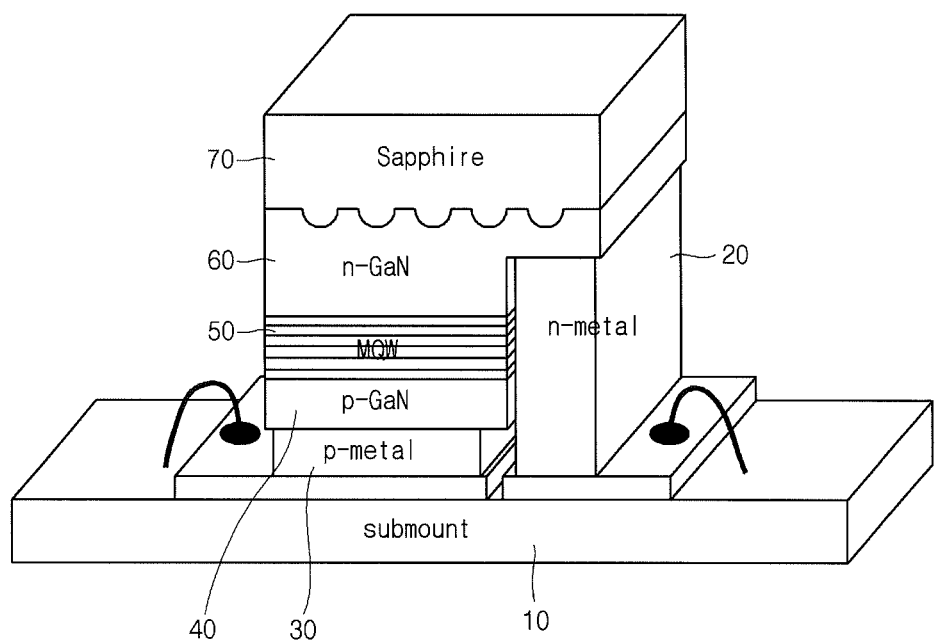
FIG. 7 shows a cross section view of a flip-chip type LED including a patterned substrate according to an embodiment of the present invention.

FIG. 7 shows a cross section view of a flip-chip type LED including a patterned substrate according to an embodiment of the present invention.

The flip-chip type LED is formed on submount 10. The flip-chip type LED includes a sapphire substrate 70, a first doping type layer 60, an active layer 50, a second doping type layer 40, and a second doping type layer 40. The first electrode 20 are connected to the first doping type layer 60 and the second electrode 30 are connected to the second doping type layer 40.

The first electrode 20 and the second electrode 30 are connected to electrode pads on submount 10 to operate the flip-chip type LED.

Figure 8:
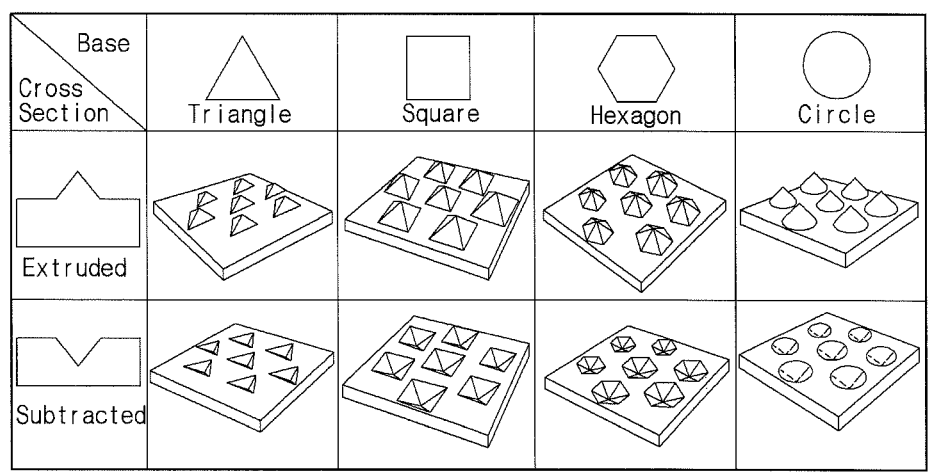
FIG. 8 shows a various kinds of patterned shapes in the patterned substrate according to an embodiment of the present invention.

FIG. 8 shows a various kinds of patterned shapes in the patterned substrate according to an embodiment of the present invention.

Referring to FIG. 8, the pyramid pattern with a circular base is also known as a cone. The horizontal axis shows 'Base' including triangle, square, hexagonal and circle. The vertical axis shows 'Cross section' including Extruded and subtracted, truncated-extruded, and truncated-subtracted.

FIG. 9 shows graphs showing simulation results according to the embodiment of the present invention. For easiness for depiction, only triangle base was shown. But, the simulation of the square, hexagonal and circle pyramid performed as well. Additionally, a hemisphere patterns structure was also added.

Referring to FIG. 9, four different kinds of the patterned substrates are used in performing simulation.

① Extruded, back surface is flat (Fresnel loss surface)
② Subtracted, back surface is flat (Fresnel loss surface)
③ Extruded, back surface is irregular (randomly-roughened back surface)
④ Subtracted, back surface is irregular (randomly-roughened back surface)

The "flat back surface" means the back surface is smooth or specular. When a light is incident on the surface, the light reflects with substantially same reflection angle as incident angle. The "irregular back surface" means the back surface is randomly-roughened back surface or perfectly-Lambertian surface. The irregular back surface can be formed by grinding the total surface. For example, the grinding system is SHUWA SGM-8000. The surface has random patterns with the size of the smaller than a corresponding wavelength. If the surface is made of the gallium nitride material, the wavelength is about 170 nm.

The simulation conditions are follows. The pitch p is 3 µm, the height h is 1.5 µm, and the diameter is 3 µm.

Figure 10:
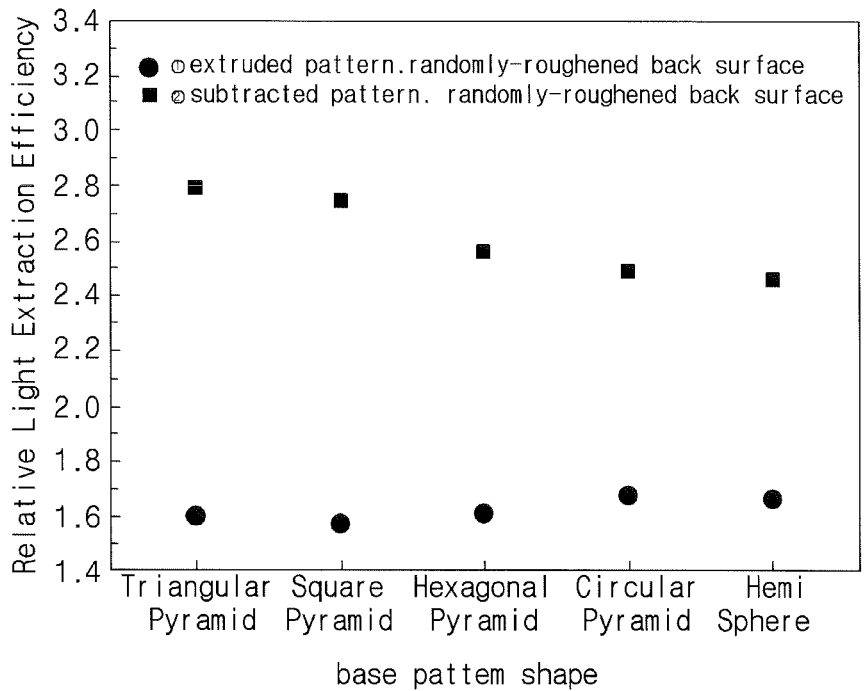
FIGS. 10 and 11 show simulated relative LEEs (Light Extraction Efficiency) of the flip-chip type LED with various pyramid patterns.
Figure 11:
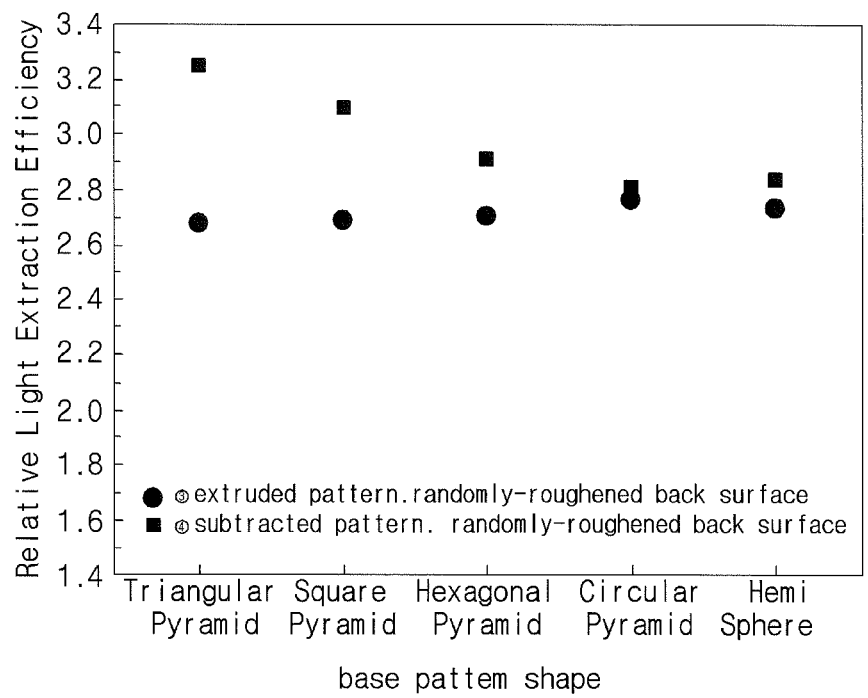

FIGS. 10 and 11 show simulated relative LEEs (Light Extraction Efficiency) of the flip-chip type LED with various pyramid patterns.

Referring to FIG. 10, the subtracted substrate has the higher LEEs than the extracted substrate. In the flat back surface, triangle and square patterns of the subtracted patterns are relatively more efficient than others. The triangle patterns are best.

Referring to FIG. 11, the irregular back surface has the higher LEEs than the flat back surface. In triangle, square, hexagonal, the subtracted substrate has the higher LEEs than the extruded. The triangle-subtracted patterns are best.

FIGS. 4 to 6 shows that, in the planar type LED, the extruded patterns have advantages. In the planar type LED, the extruded patterns help the light from the active layer not enter into the inner side of substrate due to the diffuse reflection of the patterns. The extruded patterns helps reducing reflection in the interface between the p-type semiconductor and outer material and increasing the light extracted from the outer material.

Compared to the planar type LED, the subtracted type is more effective in the flip-chip type patterned substrate. It seems that the extruded patterns help the light from the active layer enter into the inner side of substrate. After that, the total reflection is reduced between sapphire substrate and outer material due to the diffuse reflection of the patterns. It makes the amount of light extracted from outer space to be increased.

While preferable embodiments with respect to a patterned substrate for gallium nitride-based light emitting diode according to the present invention have been described, the invention is not limited thereto and may be embodied with various modifications within the scope of the appended claims, detailed description and the accompanying drawings, and such embodiments are also within the scope of the invention.

What is claimed is:

1. A patterned substrate for gallium nitride-based light emitting diode, comprising:
   a patterned substrate having patterns,
   wherein the patterns are circle type having diameters (d) and distances between the centers of the patterns are pitches (p), and the cross sections of the patterns are extruded shapes and have heights (h),
   and wherein the value of [diameter (d)/pitch (p)] is larger than (2.6)/3, and equal or smaller than 3/3.

2. The patterned substrate of claim 1, wherein the heights (h) are larger than (d/2)−0.10 μm, and are the smaller than (d/2)+0.10 μm.

3. The patterned substrate of claim 2, wherein the heights (h) are (d/2).

4. A planar type gallium nitride-based light emitting diode having a patterned substrate, the diode comprising:
   a patterned substrate having patterns,
   a buffer layer,
   a first doping layer,
   an active layer, and
   a second doping layer,
   wherein the patterns are circle type having diameters (d) and distances between the centers of the patterns are pitches (p), and the cross sections of the patterns are extruded shapes and have heights (h),
   and wherein the value of [diameter (d)/pitch (p)] is larger than 2.6/3, and equal or smaller than 3/3.

5. The patterned substrate of claim 4, wherein the heights (h) are larger than (d/2)−0.10 μm and are the smaller than (d/2)+0.10 μm.

6. The patterned substrate of claim 5, wherein the heights (h) are (d/2).

* * * * *